United States Patent [19]
Tokura et al.

[11] Patent Number: 5,659,314
[45] Date of Patent: Aug. 19, 1997

[54] DELTA SIGMA MODULATOR USING A SWITCHED CAPACITOR

[75] Inventors: Atsushi Tokura, Tenri; Shinji Hattori, Higashi-Osaka, both of Japan

[73] Assignee: Sharp Kabushiki Kaisha, Osaka, Japan

[21] Appl. No.: 462,617

[22] Filed: Jun. 5, 1995

[30] Foreign Application Priority Data

Oct. 28, 1994 [JP] Japan .................. 6-265147

[51] Int. Cl.$^6$ ........................................ H03M 3/00
[52] U.S. Cl. ................................. 341/143; 341/172
[58] Field of Search .......................... 341/143, 172

[56] References Cited

U.S. PATENT DOCUMENTS

| | | | |
|---|---|---|---|
| 4,920,544 | 4/1990 | Endo et al. | 375/26 |
| 4,994,804 | 2/1991 | Sakaguchi | 341/143 |
| 4,999,634 | 3/1991 | Brazdrum et al. | 341/172 |
| 5,057,839 | 10/1991 | Koch | 341/143 |
| 5,159,341 | 10/1992 | McCartney et al. | 341/143 |

FOREIGN PATENT DOCUMENTS

537383  2/1993  Japan .
6120837  4/1994  Japan .

Primary Examiner—Jeffrey A. Gaffin
Assistant Examiner—Thuy-Trang N. Huynh

[57] ABSTRACT

A delta sigma modulator includes, an addition circuit with 4 switches, an integration circuit, an analog-digital conversion circuit, a delay circuit, and a digital-analog conversion circuit with 2 capacitors and 6 switches. The addition circuit adds an input signal and a feedback signal, the integration circuit integrates the output of the addition circuit, the analog-digital conversion circuit converts the output of the integration circuit into a digital signal, and the delay circuit delays the output digital signal of the analog-digital conversion circuit. The two capacitors of the digital-analog conversion circuit output a charge in accordance with the output of a flip-flop, the four switches supply a power-supply electric potential and the ground electric potential to the two capacitors and also switches with a feedback digital signal and an inverted signal thereof a voltage that is supplied to the two capacitors, and the two switches connect the voltage switched by the four switches and the two capacitors. The output of the delay circuit is decoded to generate the feedback signal that is supplied to the addition circuit.

4 Claims, 7 Drawing Sheets

DELTA SIGMA MODULATOR USING A SWITCHED CAPACITOR

BACKGROUND OF THE INVENTION

1. Field of the Invention

This invention relates to a delta sigma modulator and an oversampling delta sigma type analog-digital converter, and more particularly to a delta sigma modulator using switched capacitors.

2. Description of the Related Art

There is a known oversampling type analog-digital converter circuit which uses a delta sigma modulator that makes a sampling frequency high to shift a quantize noise and a folding noise outside a signal band.

Figure 6:
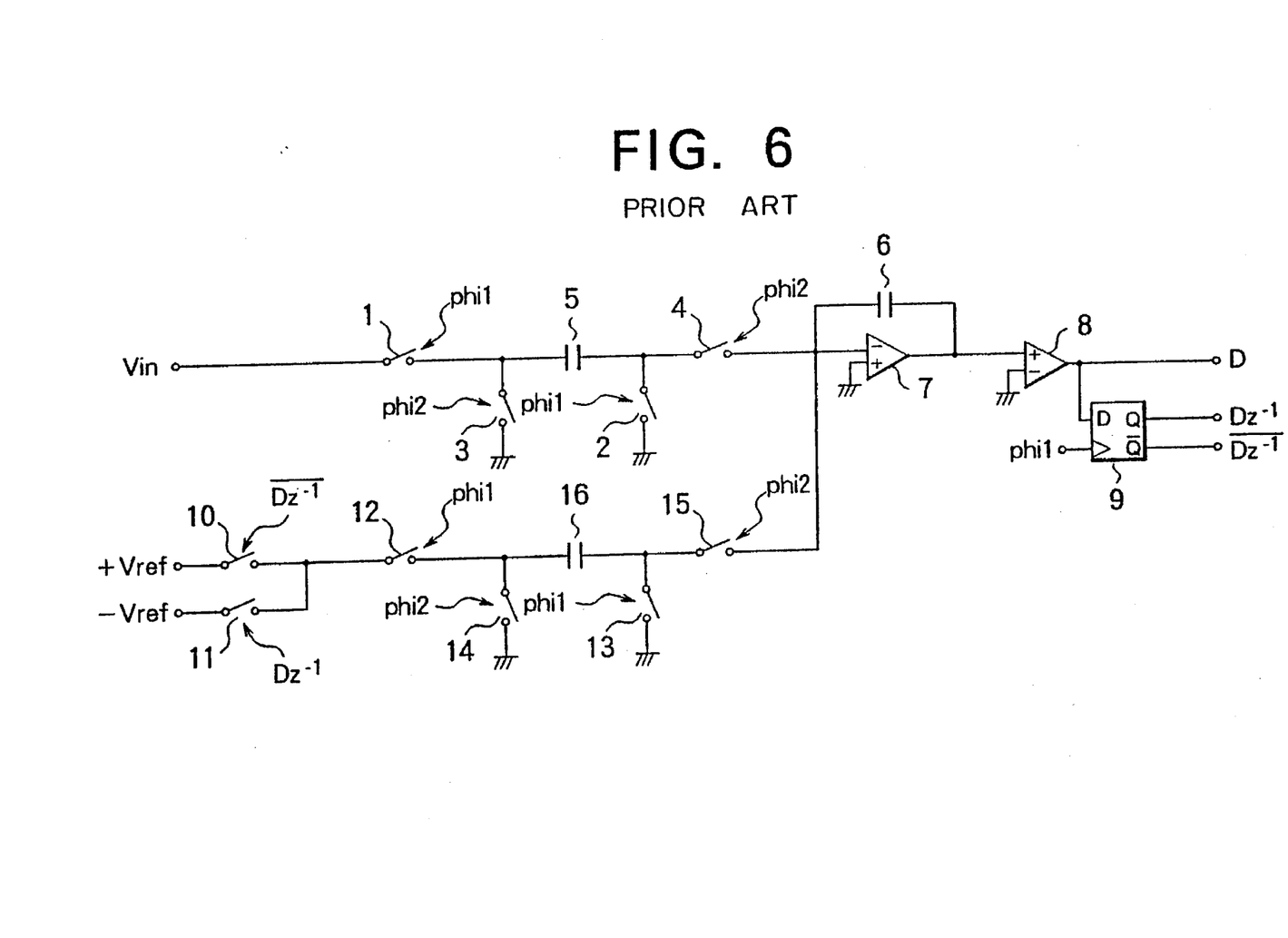
FIG. 6 is a circuit diagram showing an example of a conventional delta sigma modulator.
Figure 7:
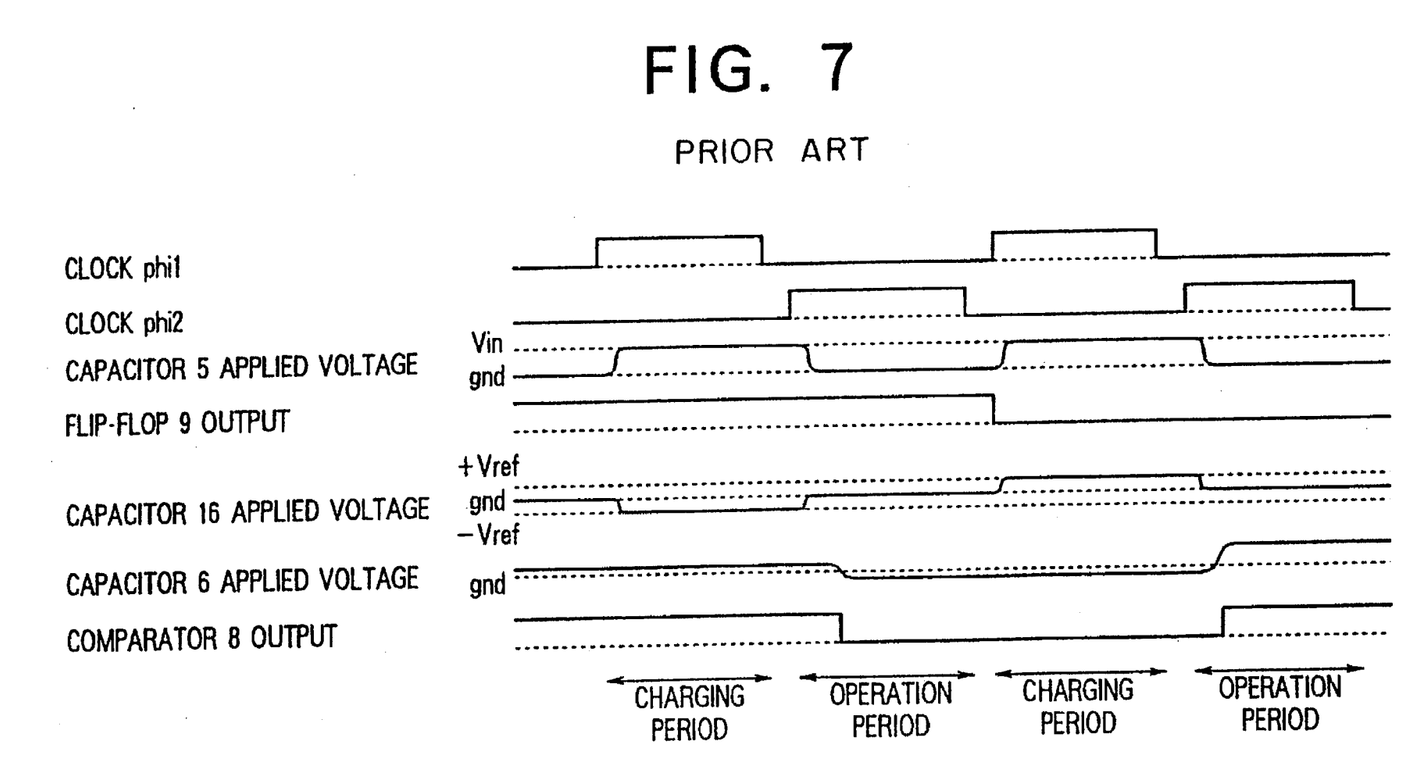
FIG. 7 is a timing diagram showing the output signal of each part of the conventional example of FIG. 6.

A conventional delta sigma modulator using switched capacitors, as shown in FIG. 6, comprises a capacitor 5 that is charged with an input signal voltage, switches 1 and 2 that are switched on with a clock phi1 going high during a charging period shown in FIG. 7 for charging the capacitor 5 with the input signal voltage, switches 3 and 4 that are switched on with a clock phi2 going high during an operation period shown in FIG. 7 for outputting the electric charge held in the capacitor 5, and a circuit consisting of a capacitor 6 and an operational amplifier 7 for integrating the input signal voltage. The delta sigma modulator further comprises a 1-bit analog-digital converter 8 for comparing the output voltage of the integrating circuit and a ground electric potential and outputting a 1-bit digital value according to the comparison, a flip-flop 9 that operates as a delay circuit for delaying the output of the analog-digital converter 8 by a period of one clock cycle, switches 10 and 11 for switching and outputting reference voltages +Vref and −Vref according to the delayed digital value, a capacitor 16 that is charged with one of the positive and negative reference voltages, switches 12 and 13 that are switched on with the clock phi1 and charge the capacitor 16 with one of the reference voltages switched by the switches 10 and 11, and switches 14 and 15 that are switched on with the clock phi2 and output the electric charge held in the capacitor 16 to the integrating circuit. The switches 10 and 11, the capacitor 16, the switches 12 and 13, and the switches 14 and 15 as a whole constitute a 1-bit digital-analog conversion circuit.

Next, the operation of the conventional delta sigma modulator will be described.

If the clock phi1 goes to a logic high level the charging period, as shown in FIG. 7, the switches 1 and 2 will be on and the capacitor 5 will be charged with the voltage Vin of the input signal. Either of switches 10 and 11 is on, depending on that the digital value delayed by the output of the 1-bit digital-analog conversion circuit is either 0 or 1. At this time, the switches 12 and 13 have been on by the clock phi1. For this reason, the capacitor is charged with either of the voltage +Vref and −Vref of the reference, depending on that the digital data is either 0 or 1.

If the clock phi2 goes to a logic high level at the operation period, the switches 3, 4 and the switches 14, 15 will be on. Therefore, the capacitors 5 and 16 are connected in parallel, and the electric charges charged in the capacitors 5 and 16 are added to the electric charge held in the capacitor 6 by the operational amplifier 7. From this, a voltage of the sum of the input voltage Vin and either of the positive and negative reference voltage Vref is integrated. The integration result is compared with the ground electric potential by the 1-bit analog-digital converter 8, a 1-bit digital data of modulation output is outputted in accordance with the sign of the signal.

Figure 4:
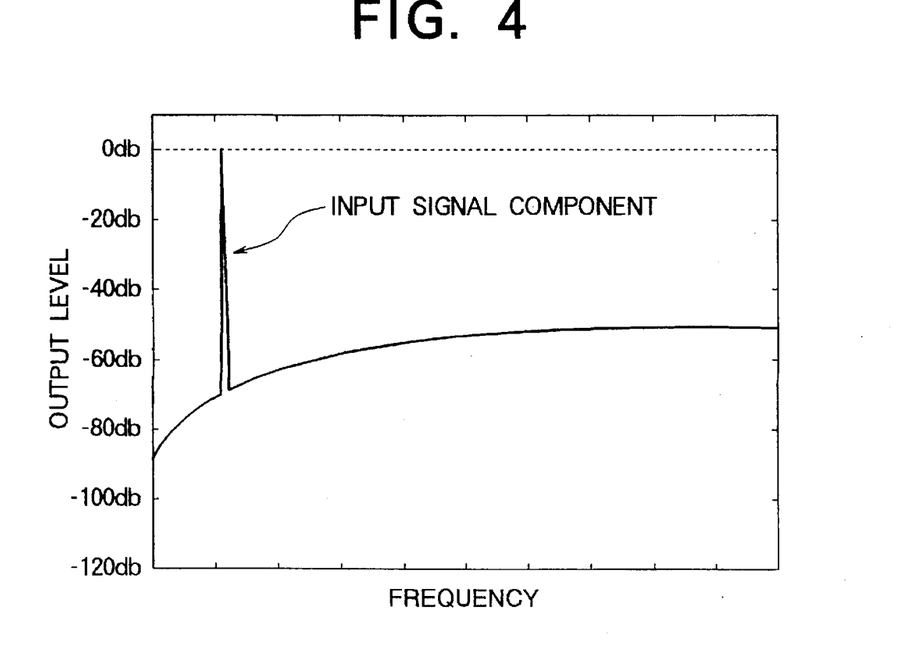
FIG. 4 is a diagram showing the spectrum of the ideal output signal of the delta sigma modulator.
Figure 5:
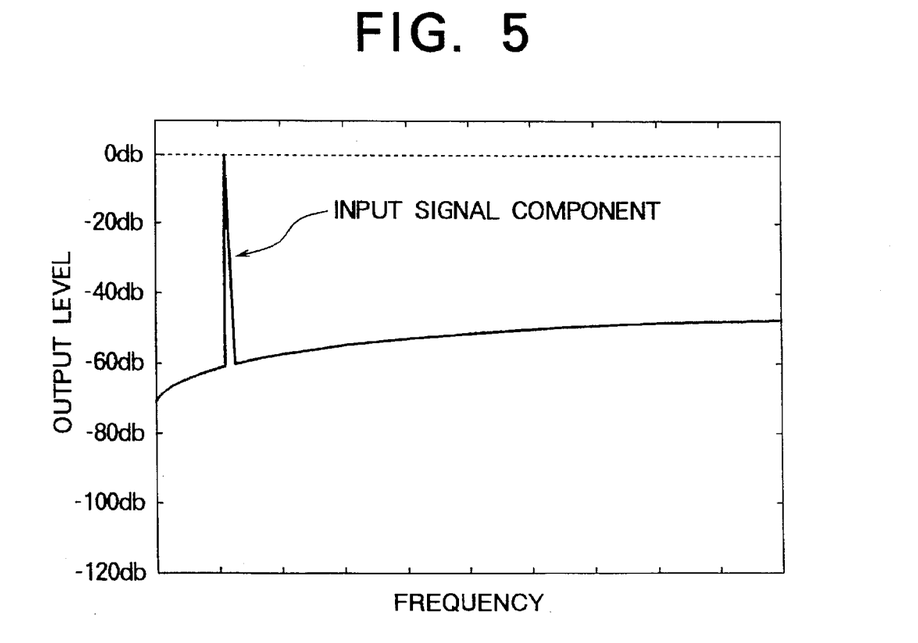
FIG. 5 is a diagram showing the spectrum of the output signal including a difference of 10% between the absolute values of the positive and negative reference voltages of the delta sigma modulator.

The above-described conventional delta sigma modulation circuit requires 4 kinds of power supplies, the positive and negative operation power supplies for operating the operational amplifier 7 and the comparator constituting the 1-bit analog-digital converter 8, and the positive and negative reference power supplies for the 1-bit digital-analog conversion circuit. Also, if there is a difference between the absolute values of the voltages of the positive and negative reference power supplies of the digital-analog conversion circuit, the feedback or the positive and negative step electric charge will be different and the spectrum of the output signal will be greatly influenced. FIG. 4 shows the spectrum of the output signal of a simulated result under an ideal condition with no difference between the absolute values of positive and negative step voltages, while FIG. 5 shows the spectrum of the output signal of a simulated result as under the condition as FIG. 4 with a difference of 10% between the absolute values of positive and negative step voltages. From this figure, it is found that the rate of the suppression of noise near the signal band, which is the characteristic of the delta sigma modulator, is reduced. For this reason, these positive and negative reference power supplies are required to be accurate power supplies in which the absolute values of the positive and negative reference voltages are equal. Therefore, the power supply circuit becomes complex and large in scale.

As means for overcoming this disadvantage, there is a delta sigma type A/D conversion circuit disclosed in Japanese Patent Application Laying Open No. 5-37383.

Figure 8A:
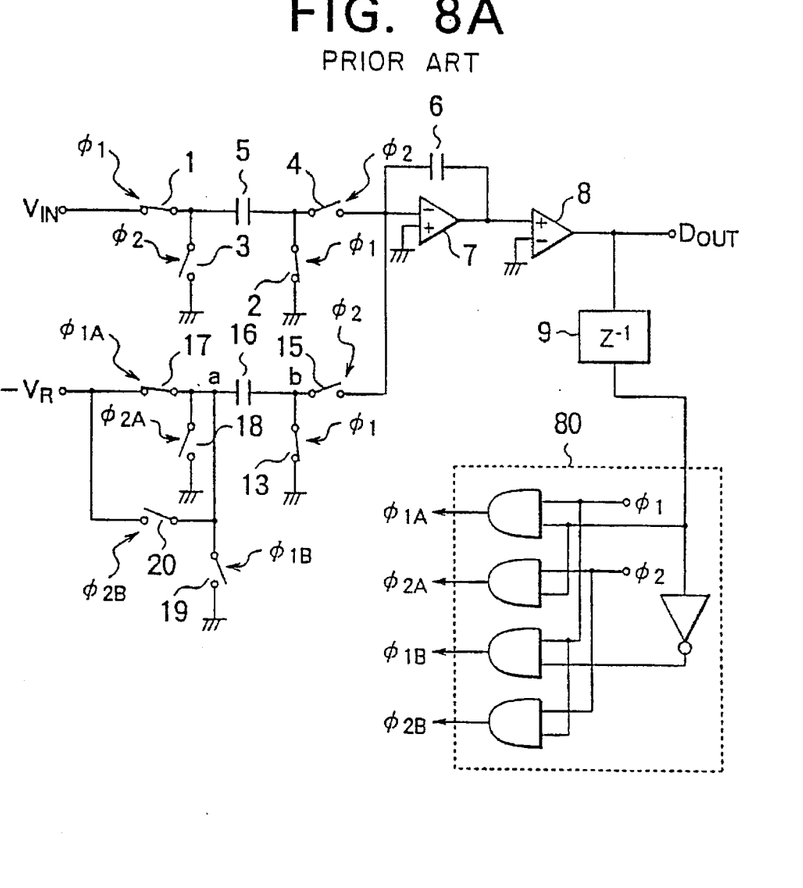
FIG. 8A is a circuit diagram showing another example of a conventional delta sigma modulator.
Figure 8B:
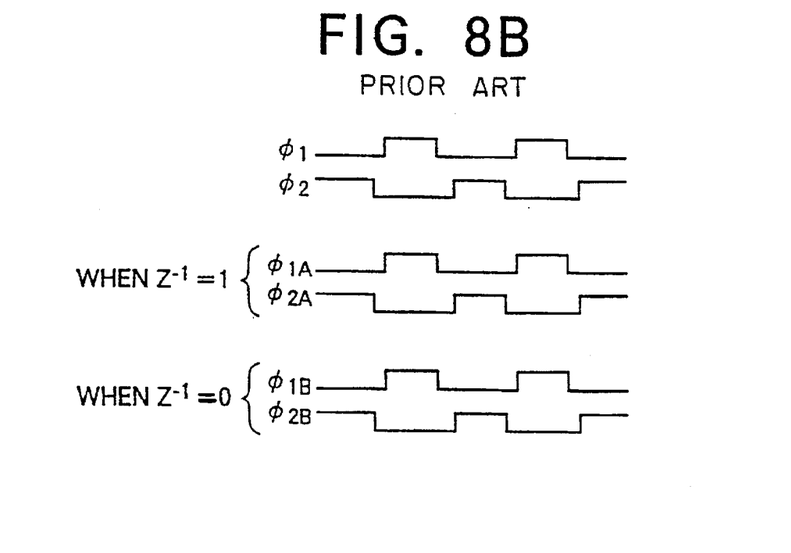
FIG. 8B is a timing diagram showing the output signal of the logic circuit 80.

As shown in FIGS. 8A and 8B, this delta sigma type A/D conversion circuit tries to obtain the positive and negative reference levels whose absolute values are equal, by making use of the thrust-up or thrust-down to a GND level caused by a feedback capacitor 16, on the basis of the voltage −VR of a kind of reference power supply. However, the delta sigma type A/D conversion shown in FIG. 8A also requires three kinds of power supplies, power supplies for operation and the reference power supply, and this reference power supply is required to be a highly accurate power supply whose impedance is low enough to keep a constant voltage irrespective of noise caused by the charging and discharging of capacity load, so there is the disadvantage that the power supply circuit becomes complex and large in scale and the current consumption in this portion causes an increase in current consumption of the entire device. Also, in FIG. 8A there is required a logic circuit such as 80 for generating timing signals ($\phi$1A to $\phi$2B) controlling the feedback capacitor 16, so this will further increase the circuit scale and the current consumption.

Also, various efforts for improving the accuracy of modulation have been made, and for example, there has been investigated a delta sigma modulator such as disclosed in Japanese Patent Application Laying Open No. 6-120837 in which the order of modulation is increased and feedback is performed on the way.

However, in using the delta sigma modulator, miniaturization and low cost are most required in accordance with its field of application, and there are some cases where a delta sigma modulator of high order such as that disclosed in the above-described Japanese Patent Application Laying Open No. 6-120837 is not needed. When the delta sigma modulator is used in the modem of a facsimile, for example, size and cost have priority over accuracy.

SUMMARY OF THE INVENTION

An object of the present invention is to provide a delta sigma modulator which dispenses with positive and negative reference power supplies.

Another object of the present invention is to provide a delta sigma modulator which is suitable for use in the modem and makes possible miniaturization and low cost.

Still another object of the present invention is to provide a delta sigma modulator which is capable of constituting a high order modulator by combining units.

A further object of the present invention is to provide an oversampling delta sigma type analog-digital converter which includes any one of the above-described delta sigma modulators.

The foregoing objects are accomplished in accordance with one aspect of the present invention by providing a delta sigma modulator comprising addition means for adding an input signal and a feedback signal, integration means for integrating an output of said addition means, analog-digital conversion means for quantizing said output of said integration means to convert it into a digital signal, delay means for delaying an output of said analog-digital conversion means, and digital-analog conversion means for decoding an output of said delay means and outputting said feedback signal, wherein:

said addition means has a first capacitor that is charged with an input voltage during a first period, and adds at a second period an electric charge charged in the first capacitor during said first period and an electric charge of said feedback signal outputted from said digital-analog conversion means;

said integration means has operational amplifying means and a second capacitor for connecting an output of said operational amplifying means with a negative input of said operational amplifying means; and said digital-analog conversion means has a third capacitor, a fourth capacitor having a capacity equal to said third capacity, and switching means for switching a first and a second voltage sources so that in said first period said third capacitor is charged with said first voltage source and said fourth capacitor is charged with said second voltage source, and in said second period, when said output of said delay means is 0, a voltage to be applied to said third capacitor is switched to said second voltage source to output an electric charge equal to an electrostatic capacity of said third capacitor multiplied by a voltage obtained by subtracting an electric potential of said first voltage source from an electric potential of said second voltage source, and when said output of said delay means is 1, a voltage to be applied to said fourth capacitor is switched to said first voltage source to output an electric charge equal to an electrostatic capacity of said fourth capacitor times a voltage obtained by subtracting an electric potential of said second voltage source from an electric potential of said first voltage source.

The switching means may be constructed such that it, in said first period, connects ground to second terminals of said third and fourth capacitors, connects said first voltage source to a first terminal of said third capacitor, and connects said second voltage source to a first terminal of said fourth capacitor, in said second period, connects second terminals of said third and fourth capacitors to the output, and when said output of said delay means is 0, connects said second voltage source to said first terminal of said third capacitor, and when said output of said delay means is 1, connects said first voltage source to said first terminal of said fourth capacitor.

A quantity of electric charge outputted from said digital-analog conversion means is preferable to be set by said electrostatic capacities of said third and fourth capacitors.

The digital-analog conversion means may connect said first and second voltage sources to any of a positive power-supply electric potential of power supplies in operation common to said operational amplifying means, said analog-digital conversion means, and an external connection circuit, a negative power-supply electric potential of power supplies in operation, and an intermediate electrical potential between said positive and negative power-supply electric potentials of the power supplies in operation.

The delta sigma modulator may be constituted by a combination of two or more sets of said addition means, said integration means, and said digital-analog conversion means.

In the delta sigma modulator of the present invention, by the addition means the first capacitor is charged in the first period with an input voltage, and in the second period, an electric charge equal to the input voltage charged in the first period in the first capacitor multiplied by the electrostatic capacity of the first capacitor, and an electric charge of the feedback signal from the digital-analog conversion means are added and outputted. By the integration means the output of the addition means is integrated and outputted. By the analog-digital conversion means the output of the integration means is quantized and converted into a digital signal and outputted. By the delay means the digital signal of the output of the analog-digital conversion means is delayed by a predetermined time and outputted. By the digital-analog conversion means, in the first period the third capacitor is charged with the first voltage source and the fourth capacitor having the same capacity with the third capacitor is charged with the second voltage source, and in the second period, when the output of the delay means is 0, a voltage to be applied to the third capacitor is switched to the second voltage source to output an electric charge equal to an electrostatic capacity of the third capacity multiplied by a voltage obtained by subtracting an electric potential of the first voltage source from an electric potential of the second voltage source, and when the output of the delay means is 1, a voltage to be applied to the fourth capacitor is switched to the first voltage source to output an electric charge equal to an electrostatic capacity of the fourth capacity multiplied by a voltage obtained by subtracting an electric potential of the second voltage source from an electric potential of the first voltage source. In this way, the digital signal of the output of the delay circuit is decoded to generate a feedback signal.

Therefore, since the electric charge that is outputted from the digital-analog conversion circuit and moved to the integrator does not depend upon the reference power supply but is determined by the capacity of the capacitor, positive and negative reference power supplies for setting a step electric charge quantity outputted from the digital-analog conversion circuit become unnecessary. Also, if the feedback signal includes an off-set, that component will be integrated by the integrator, so the off-set error is accumulated and an erroneous modulation output is outputted with a particular frequency. In this respect, a voltage for charging the capacitor supplying the above-described electric charge is only a power-supply voltage, regardless of an input to the digital-analog conversion circuit. Therefore, the absolute value of a quantity of electric charge to be outputted does not change by its polarity. As a result, the component corresponding to the off-set of the feedback signal is eliminated, noise is reduced, and the signal-to-noise ratio of the modulation output is improved.

Also, when a plurality of sets of the addition means, the integration means, and the digital-analog conversion means are connected in parallel, in series or with a combination thereof to constitute a high order delta sigma modulator, the above-described operation is repeated plural times, so the noise characteristic is improved greatly.

Further, when an oversampling delta sigma type analog-digital converter is constituted with the delta sigma modulator of the present invention, by the same operation as the above-described operation the circuit construction can be made simpler and also the noise characteristic can be improved.

Further object and advantages of the present invention will be apparent from the following description of the preferred embodiments of the invention as illustrated in the accompanying drawings.

DESCRIPTION OF THE PREFERRED EMBODIMENTS

A preferred embodiment of a delta sigma modulator of the present invention will hereinafter be described with reference to the accompanying drawings.

Figure 1:
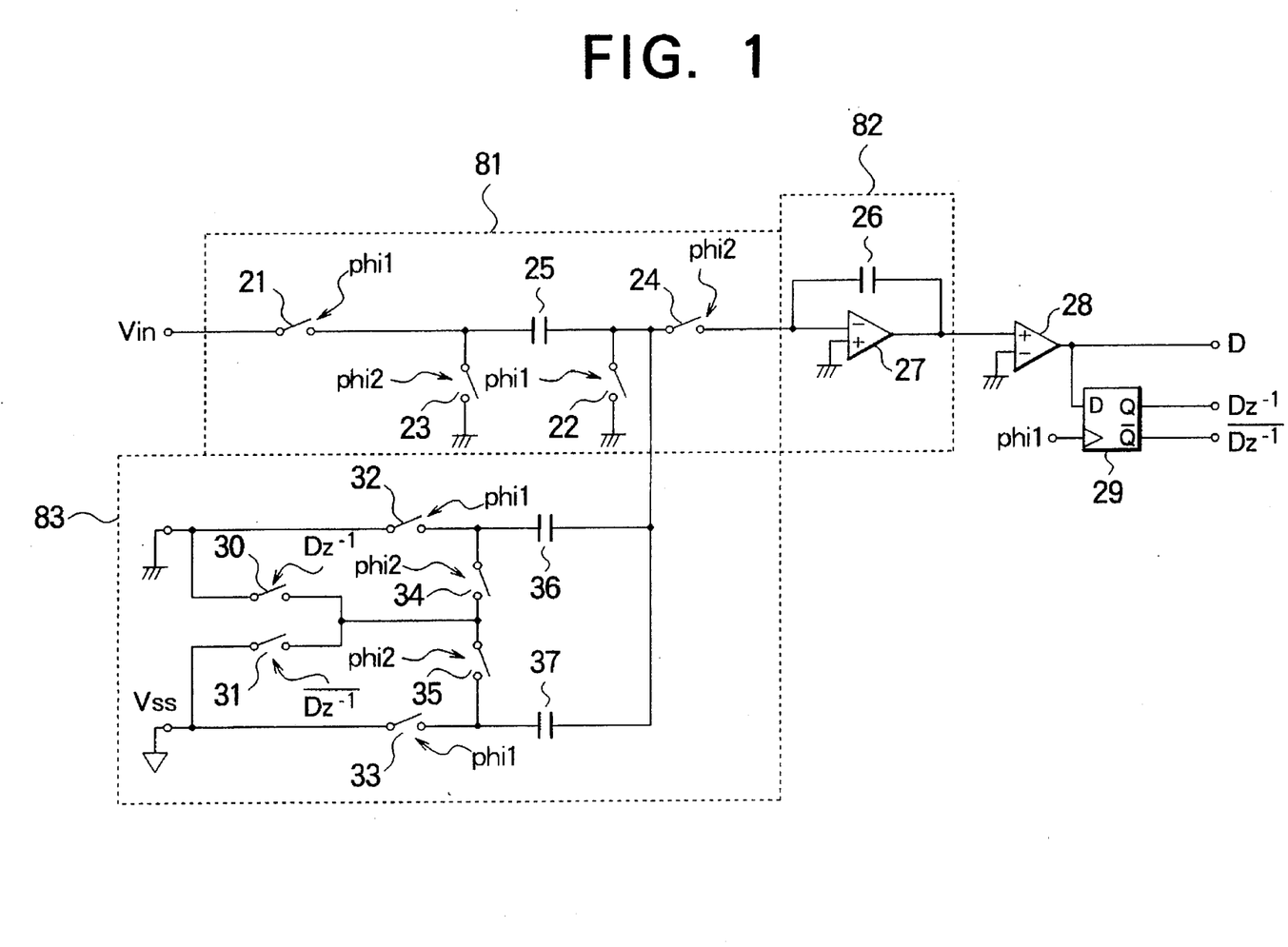
FIG. 1 is a circuit diagram showing a first embodiment of a delta sigma modulator of the present invention.

The delta sigma modulator of this embodiment, as shown in FIG. 1, comprises an addition circuit 81 as addition means for adding a feedback signal to an input voltage, an integrating circuit 82 as integrating means for integrating an output of the addition circuit 81, a 1-bit analog-digital converter 28 as analog-digital conversion means for quantizing the output of the integrating circuit 82 to convert it into a digital signal, a flip-flop 29 as delay means for delaying the digital signal of the output of the analog-digital converter 28 by one cycle, and a digital-analog conversion circuit 83 as digital-analog conversion means for decoding the digital signal of the output of the flip-flop 29 to generate a feedback signal.

The addition circuit 81 is constituted by a first capacitor 25 with a capacity Ci that is charged with an input signal, switches 21 and 22 that are switched on with a clock phi1 going to a logic high during a charging period and charges the capacitor 25 with an input signal voltage, and switches 23 and 24 that are switched on with a clock phi2 going to a logic high during an operation period of the reverse phase and output the electric charge held in the capacitor 25. The integrating circuit 82 is constituted by an operational amplifier 27 as operational amplifying means and a second capacitor 26 with a capacity Cs for connecting the output of the operational amplifier 27 and a negative input. The digital-analog conversion circuit 83 is constituted by a third capacitor 36 with a capacity Cr for outputting an electric charge corresponding to fed back digital data, a fourth capacitor 37 having the same capacity Cr, switches and 33 that are switched on with the clock phi1 and constitute one structural element of switching means for adding a power supply electric potential and a ground electric potential to the capacitors 36 and 37, switches 30 and 31 constituting one structural element of switching means for switching a voltage that is added to the capacitors 36 and 37 with a feedback digital signal $Dz^{-1}$ and its inverted signal $\overline{Dz^{-1}}$, and switches 34 and 35 for connecting synchronized with a clock phi2 the voltage switched with these switches and the capacitors 36 and 37.

Next, the operation of this embodiment will be described with reference to the timing diagram of FIG. 2.

If the clock phi1 goes high at a charging period, the switches 21 and 22 will be on and the capacitor 25 will be charged with an input voltage Vin. Also, the switches 32 and 33 are switched on, so the capacitor 36 is connected to the ground electric potential and the held electric charge is discharged. Further, the capacitor 37 is charged with Vss which is a negative power-supply voltage. Since the switch 24 connected to the input of the operational amplifier 27 is open the output does not change.

Figure 2:
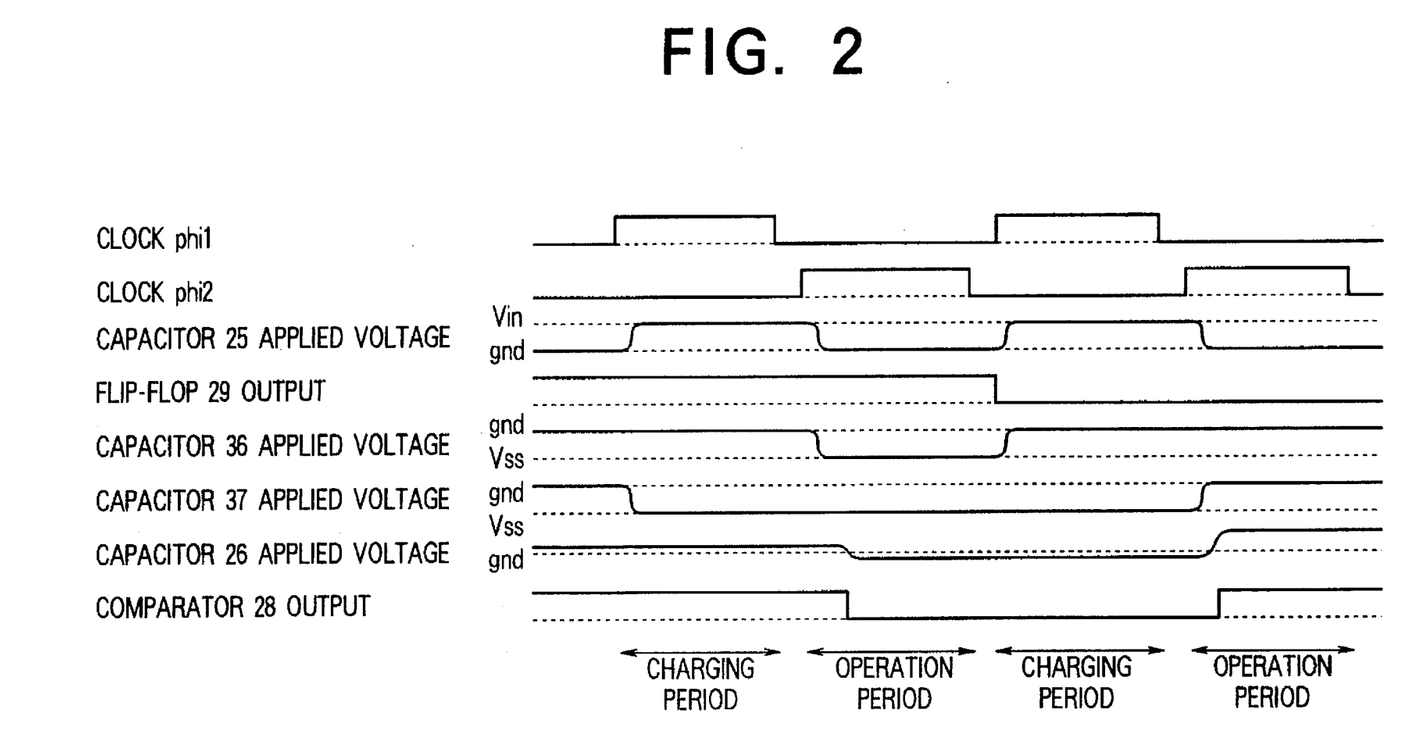
FIG. 2 is a timing diagram showing the output signal of each part of the first embodiment.

If at the operation period of FIG. 2 the clock phi1 goes low and the clock phi2 goes high, the switches 21 and 22 will be off and the switches 23 and 24 will be on. At this time, the input terminal of the operational amplifier 27 goes to a value very near to the ground electric potential by the feedback of the capacitor 26. For this reason, the electric charge $Q1=Ci \cdot Vin$ held in the capacitor 25 is added to the capacitor 26.

When by the clock the switches 32 and 33 are off and the switches 34 and 35 are on, the switch 31 will be on, from the operation result of a previous cycle, if the output $\overline{Dz^{-1}}$ of the flip-flop 29 of the delay element is high. Therefore, the electric potential of the electrode of the capacitor 36 on side of the switch 34 is switched from the ground electric potential to the electric potential Vss of the negative power-supply voltage, as shown in FIG. 2. The capacitor 36, therefore, is charged with the negative power-supply voltage. For this reason, an electric charge of $Qr=Cr \cdot Vss$ held in the capacitor 36 is added to the capacitor 26.

On the other hand, when the output $Dz^{-1}$ of the flip-flop 29 is high, the switch 30 is on. Therefore, if the switches 32 and 33 are switched off and the switches 34 and 35 are switched on by the clock, the electric potential of the electrode of the capacitor 37 on side of the switch 35 will be switched from the electric potential Vss of the negative power-supply voltage to the ground electric potential, as shown in FIG. 2. Therefore, the electric charge held in the capacitor 37 is discharged with the negative power-supply voltage. For this reason, and in contrast with the case where $\overline{Dz^{-1}}$ is high, the electric charge $Qr=Cr \cdot Vss$ held in the capacitor 37 is added to the capacitor 26.

Now, the change of the voltage that is applied to the capacitor 26 due to the movement of the electric charge becomes:

$$\Delta Vcs = k1 \cdot (Vin \pm k2 \cdot Vss)$$

Since $k1=Ci/Cs$ and $k2=Cr/Ci$, the change of the voltage that is applied to the capacitor 26 becomes:

$$\Delta Vcs = Ci/Cs \cdot Vin \pm Cr/Cs \cdot Vss$$

Therefore, the voltage of the capacitor 26 becomes the same as a value ±Cr/Cs·Vss obtained by adding a previous value to the input signal voltage Vin multiplied by the ratio of Ci/Cs and the capacity Ci of the capacitor 25 and the capacity Cs of the capacitor 26, and then adding or subtracting the power supply voltage Vss multiplied according to the output of the delay circuit by the ratio Cr/Cs of the capacity Cr of the capacitors 36, 37 and the capacity Cs of the capacitor 26. In the above-described equation, Ci/Cs is equivalent to the coefficient of the integrator and is a constant value that is determined by the dynamic range of the circuit or the input voltage. Therefore, the feedback step voltage becomes ±Cr/Cs·Vss.

From these facts, even if a reference power supply is not used, the same result of integration as the conventional circuit in which positive and negative voltages whose absolute values are equal are used as references will be obtained by changing the capacity Cr of the capacitors 36 and 37. Therefore, the spectrum of that output signal becomes equal to the theoretical value shown in FIG. 4, and there is no occurrence of noise that is caused by the step voltage error.

Also, while in the embodiment of FIG. 1, the ground and the negative power-supply voltage have been used as the voltage sources of the 1-bit digital-analog conversion circuit which is a feedback circuit, there is also a conceivable structure in which a positive power-supply voltage and the ground, or a positive power-supply voltage and a negative power-supply voltage are used.

Figure 3:
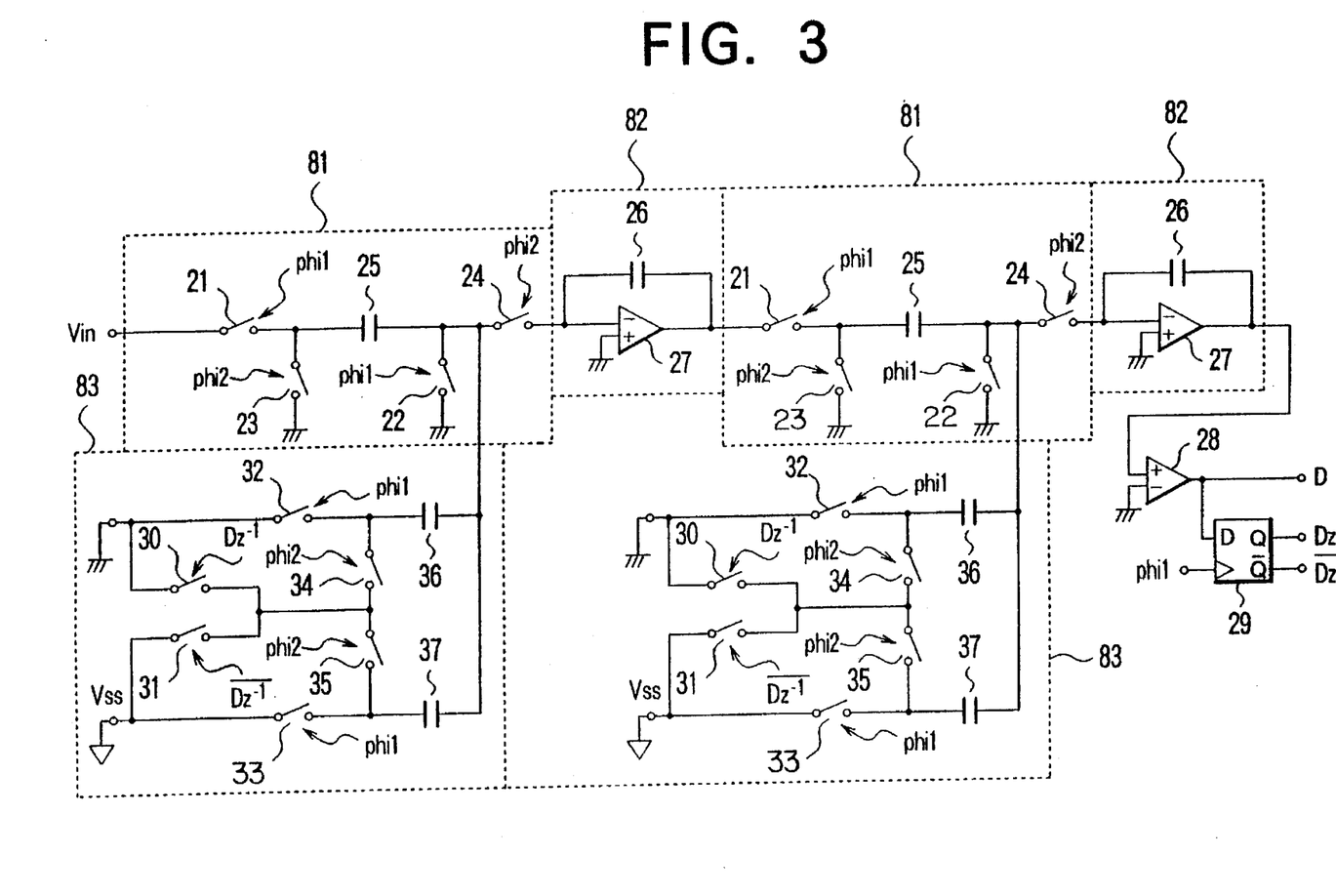
FIG. 3 is a circuit diagram showing a second embodiment of the delta sigma modulator of the present invention.

Next, a second embodiment of the present invention will be described with reference to FIG. 3. The same reference numerals and characters will be applied to the same parts as the first embodiment of FIG. 1 and a detailed description of the same parts will be omitted.

In the delta sigma modulator of this embodiment, two blocks each comprising an addition circuit 81, an integrating circuit 82, and a 1-bit digital-analog conversion circuit 83 are connected in series and constitute a second order delta sigma modulator in which an integration is performed twice. The operation of each part is identical with that of the first embodiment. As with this embodiment, a plurality of blocks comprising an addition circuit 81, an integrating circuit 82, and a 1-bit digital-analog conversion circuit 83 may be connected in parallel, in series or with a combination thereof to constitute a delta sigma modulator of more than one order. If a higher order delta sigma modulator is made by increasing the number of stages, the noise characteristic will be more improved. Therefore, if cost is not taken into consideration, a second order than a first order or a third order than a second order is preferable to be used.

Also, if the above-described delta sigma modulator is used to constitute an oversampling delta sigma type analog-digital converter, the noise characteristic can be improved.

Many widely different embodiments of the present invention may be constructed without departing from the spirit and scope of the present invention. It should be understood that the present invention is not limited to the specific embodiments described in the specification, except as defined in the appended claims.

What is claimed is:

1. A delta sigma modulator comprising:

addition means for adding an input signal and a feedback signal;

integration means for integrating an output of said addition means;

analog-digital conversion means for quantizing said output of said integration means to convert it into a digital signal;

delay means for delaying an output of said analog-digital conversion means; and digital-analog conversion means for decoding an output of said delay means and outputting said feedback signal, wherein said addition means includes a first capacitor to be charged with an input voltage during a first period, and said addition means adds at a second period an electric charge in said first capacitor during said first period to an electric charge of said feedback signal outputted from said digital-analog conversion means, said integration means includes operational amplifying means and a second capacitor connected an output of said operational amplifying means with a negative input of said operational amplifying means, and said digital-analog conversion means includes a third capacitor, a fourth capacitor having a capacity equal to said third capacitor, one end of said third capacitor and one end of said fourth capacitor being connected with each other, and switching means for connecting the other end of said third capacitor with a first voltage source and connecting the other end of said fourth capacitor with a second voltage source in said first period, and said switching means connecting said other end of said third capacitor and said other end of said fourth capacitor with a common terminal, connecting said common terminal with said second voltage source, when an output of said delay means is 0, so as to output an electric charge equal to an electrostatic capacity of said third capacity multiplied by a voltage obtained by subtracting an electric potential of said first voltage source from an electric potential of said second voltage source, and connecting said common terminal with said first voltage source, when said output of said delay means is 1, so as to output an electric charge equal to an electrostatic capacity of said fourth capacity multiplied by a voltage obtained by subtracting an electric potential of said second voltage source from an electric potential of said first voltage source, in said second period.

2. The delta sigma modulator according to claim 1, wherein said switching means connects said first voltage source with said other end of said third capacitor, said second voltage source with said other end of said fourth capacitor and connects the ground with said one ends of said third and fourth capacitors, in said first period, and connects said one ends of said third and fourth capacitors with an output of said digital-analog conversion means, and connects said second voltage source with said common terminal, when said output of said delay means is 0, connects said first voltage source with said common terminal, when said output of said delay means is 1, in said second period.

3. The delta sigma modulator according to claim 1, wherein a quantity of electric charge outputted from said digital-analog conversion means is determined by said electrostatic capacities of said third and fourth capacitors.

4. The delta sigma modulator according to claim 1, wherein said delta sigma modulator includes a combination of two or more sets of said addition means, said integration means, and said digital-analog conversion means.

* * * * *